United States Patent

Tawada

Patent Number: 6,145,116
Date of Patent: Nov. 7, 2000

[54] LAYOUT DESIGN APPARATUS

[75] Inventor: Shigeyoshi Tawada, Tokyo, Japan

[73] Assignee: NEC Corporation, Tokyo, Japan

[21] Appl. No.: 08/847,628

[22] Filed: Apr. 28, 1997

[30] Foreign Application Priority Data

Apr. 27, 1996 [JP] Japan .................................. 8-131347

[51] Int. Cl.[7] .................................................. G06F 17/50
[52] U.S. Cl. ............................................... 716/6; 716/10
[58] Field of Search .................................. 364/488, 489, 364/490, 491, 578; 395/500.07, 500.12, 500.05, 500.06, 500.11, 500.13, 500.14, 500.03

[56] References Cited

U.S. PATENT DOCUMENTS

| | | | |
|---|---|---|---|
| 5,410,491 | 4/1995 | Minami | 364/491 |
| 5,557,779 | 9/1996 | Minami | 395/500 |
| 5,638,291 | 6/1997 | Li et al. | 364/490 |
| 5,764,528 | 6/1998 | Nakamura | 364/489 |
| 5,838,580 | 11/1998 | Srivatsa | 364/489 |
| 5,838,581 | 11/1998 | Kuroda | 364/491 |
| 5,859,776 | 1/1999 | Sato et al. | 364/428.28 |

FOREIGN PATENT DOCUMENTS

| | | |
|---|---|---|
| 4-279976 | 10/1992 | Japan . |
| 5-40802 | 2/1993 | Japan . |
| 5-120377 | 5/1993 | Japan . |
| 5-181938 | 7/1993 | Japan . |

OTHER PUBLICATIONS

T. Aoki et al, "Fan–Out Restructuring Algorithm for Post–placement Timing Optimization", ASP–DAC '95 CHDL '95 VLSI '95, 1995, Aug. 8–Sep. 1, 1995, pp. 417–422, Chiba, Japan.

*Primary Examiner*—Paul R. Lintz
*Assistant Examiner*—Leigh Marie Garbowski
*Attorney, Agent, or Firm*—Sughrue, Mion, Zinn, Macpeak & Seas, PLLC

[57] ABSTRACT

A layout design apparatus for arranging circuit elements and routing the circuit elements to perform a layout design of a logical circuit, includes path delay analysis means for performing delay analysis processing on a layout result which is obtained by performing a layout design of a logical circuit with a predetermined method, relay buffer insertion means for performing a logical alteration of the logical circuit to reduce the delay error when a delay error exists in the layout result through the delay analysis processing, and incremental routing means for rerouting the layout result in accordance with the result of the logical alteration by the logical altering means.

13 Claims, 17 Drawing Sheets

FIG. 2
| BUFFER GATE TYPE | BUFFER GATE SYMBOL | BUFFER GATE DELAY |
|---|---|---|
| BUFFER GATE 401 | 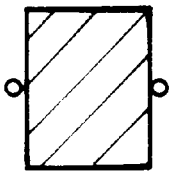 | 0.5T |
| BUFFER GATE 402 | 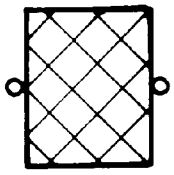 | 1T |
| BUFFER GATE 403 | 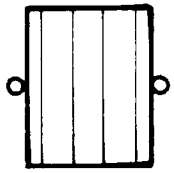 | 2T |

LAYOUT DESIGN APPARATUS

BACKGROUND OF THE INVENTION

1. Field of the Invention

The present invention relates to a layout design apparatus for a semiconductor device which automatically performs a design for the placement, routing, etc. of circuit elements in a logical circuit such as an LSI, a print board or the like, and more particularly to a layout design apparatus having a delay error improving (reducing) function.

2. Description of the Related Art

In general, a layout design for the placement and routing of circuit elements in a logical circuit such as an LSI (large scale integrated circuit), ULSI (ultra large scale IC), a print board or the like is performed by a CAD (computer aided design) using a computer. This type of CAD system (hereinafter referred to as "layout design apparatus") performs not only a layout design of a logical circuit, but also a delay analysis to check whether the designed logical circuit satisfies a delay-time requirement which is based on various factors such as synchronization, etc.

In conventional layout design apparatuses as described above, an automatic placement and routing processing which aims to shorten the total length of routing and enhance routing performance is performed on the basis of logical connection information of a logical circuit. When a delay error of a path occurs during a delay analysis after an placement and routing process, the placement and the routing are manually corrected, or the logical connection information is corrected to retry the layout design, thereby eliminating the delay error.

Further, the gates on paths which have severe delay restriction are manually arranged to be adjacent to one another in advance so that the delay restriction is not violated, or in some cases the routing is manually performed, thereby reducing the delay error.

There has been also proposed a layout design apparatus for reducing the delay error by using an automatic placement and routing means having a delay analyzing means. In this type of layout design apparatus, the delay error is reduced without altering the logical connection relation of a logical circuit by improving the placement of circuit elements and a method of routing processing, etc. Such techniques are disclosed in Japanese Laid-open Patent Application No. Hei-4-279976, No. Hei-5-40802, No. Hei-5-120377, No. Hei-5-181938, etc.

There is now considered a circuit construction having a logical connection relation as shown in FIG. 9, in which flip flops 201 and 202 and gates 203 to 206 are arranged and these elements (blocks in FIG. 9) are connected to one another through nets 207 to 214. This logical circuit has a path 215 as a path among the flip flops (hereinafter referred to as an inter-flip-flop path). FIG. 17 shows a result which is obtained by performing a lay-out design on the basis of a conventional layout design apparatus.

Specifically, FIG. 17 shows the result which is obtained by performing an placement and routing work on the blocks of the flip flops 201, 202 and the gates 203 to 206, the connection routing of the input/output terminals of these blocks, the input/output routing from the external to these blocks, and the path 215 for these blocks on the basis of the input information in consideration of the conditions, logical connection information such as the number of inputs, the number of outputs, gain and loss, fan-in and fan-out, an input/output logical value, a permissible power source voltage, etc., physical information such as the occupation area of each block, etc. By the placement/routing connection work, routing results 301 to 308 shown in FIG. 17 are obtained. In this placement, the horizontal line of the routing is crooked at the routing result 304 as shown in FIG. 17. Further, the path 215 between the flip flops 201 and 202 is similarly crooked.

As described above, according to the conventional layout design apparatus, the layout design is performed on the basis of only the logical connection information and physical information. Accordingly, if through a delay analysis on an placement and routing result shown in FIG. 17 the delay restriction required to the logical circuit concerned is violated, the manual correction work of the placement and routing or the alteration of the logical connection information as described above must be carried out to retry the placement and routing processing in order to obtain an placement and routing result which satisfies the delay restriction.

As described above, the conventional layout design apparatus performs the placement and routing processing on the basis of only the logical connection information and physical information, and thus a path delay error may occur in a path having a severe delay time restriction through the delay analysis after the placement and routing process.

The delay error thus occurring is manually corrected, or the logical connection information is corrected, or an placement and routing work is beforehand manually performed in consideration of the delay restriction on a critical path to which occurrence of a delay error is expected. Therefore, a large number of steps are required for the logical correction work, the placement and routing work and the correction work of the placement and routing.

Still further, since the delay error is reduced by using the automatic placement and routing means having the delay analysis means with no logical alteration, the improvement (reduction) of the delay error has a limitation.

SUMMARY OF THE INVENTION

The present invention has been implemented to overcome the above drawbacks of the conventional layout design apparatus, and has an object to provide a layout design apparatus which can avoid occurrence of a delay error as much as possible by automatically performing correction processing of placement and routing due to logical alteration, and reduce the number of steps needed for a manual correction work of the placement and routing when the delay error occurs, thereby enhancing the performance of a designed logical circuit, heightening the integration degree of the placement and routing, implementing the high-speed operation of the processing and increasing productivity.

In order to attain the above object, according to the present invention, a layout design apparatus for arranging circuit elements and routing the circuit elements to perform a layout design of a logical circuit, is characterized by including delay analysis means for performing delay analysis processing on a layout result which is obtained by performing a layout design of a logical circuit with a predetermined method, logical altering means for performing a logical alteration of the logical circuit to weed out the delay error, and rerouting means for rerouting the layout result in accordance with the result of the logical alteration by the logical altering means.

In the above-described layout design apparatus, the logical altering means is provided with repeater gate insertion means for inserting a repeater gate having a delay characteristic and a drive performance which are required for a predetermined net of the logical circuit.

In the above-described layout design apparatus, the rerouting means is provided with repeater gate placement means for arranging the repeater gate in accordance with the layout result on the basis of the insertion result of the repeater gate insertion means.

In the above-described layout design apparatus, when another circuit element exists at an placement position which is indicated for the repeater gate by the repeater gate insertion means, the repeater gate placement means arranges the repeater gate at a position which is adjacent to the placement position and at which the repeater gate can be arranged.

In the above-described layout design apparatus, the rerouting means includes repeater gate placement means for arranging the repeater gate in accordance with the layout result on the basis of the insertion result of the repeater gate insertion means, and placement error eliminating means for affording preference to the repeater gate and displacing another element when the other element exists at an placement position which is indicated for the repeater gate by the repeater gate insertion means.

In the above-described layout design apparatus, the repeater gate comprises a buffer gate.

In the above-described layout design apparatus, the repeater gate comprises an inverter, and the repeater gate insertion means inserts inverters into the net with even-number of inverters being set as a group.

BRIEF DESCRIPTION OF THE DRAWINGS

FIG. 2 is a block diagram showing the type of a relay buffer used in the embodiment;

DETAILED DESCRIPTION OF THE PREFERRED EMBODIMENTS

Figure 1:
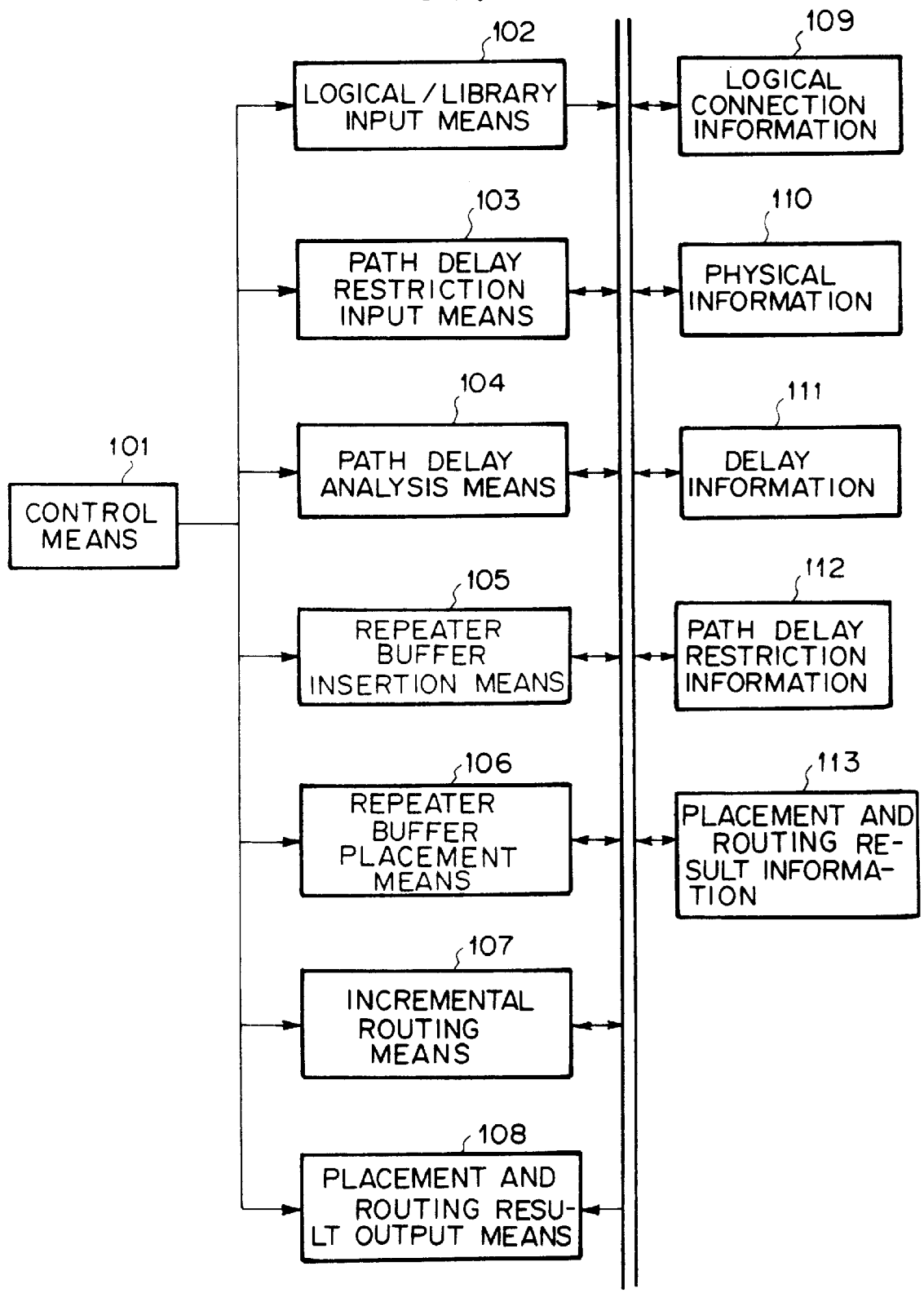
FIG. 1 is a block diagram showing the construction of a layout design apparatus according to a first embodiment of the present invention.

Preferred embodiments according to the present invention will be described with reference to the accompanying drawings FIG. 1 is a circuit block diagram showing the construction of a layout design apparatus according to a first embodiment of the present invention.

As shown in FIG. 1, the layout design apparatus of this embodiment includes logical/library input means 102 for inputting logical connection information, etc., path delay restriction input means 103 for inputting a delay restriction of each path, path delay analyzing means 104 for performing a delay analysis on a path, relay buffer insertion means 105 and relay buffer placement means 106 for inserting a relay buffer required for a net on a path, incremental routing means 107 for rerouting the net, placement and routing output means 108 for outputting an placement and routing result, and control means 101 for controlling these means.

The logical/library input means 102 is implemented by an input device such as a keyboard, and a CPU, a RAM, etc. which are controlled with programs, and various information used for a layout design is input through the logical/library input means 102. The information input through the logical/library input means 102 contains logical connection information 109 between circuit blocks constituting a logical circuit, physical information 110 on an placement result of the circuit blocks and a routing result connecting the circuit blocks, and delay information 111 such as parameters used to calculate a routing delay which are required for a delay analysis and internal delays of the circuit blocks.

The path delay restriction input means 103 is implemented by an input device such as a keyboard or the like, and a CPU, a RAM, etc. which are controlled by programs, and it is used to input path delay restriction information 112 which is a restriction value of a delay time for determining the target performance of the logical circuit every path in the logical circuit. A minimum delay time restriction representing the minimum value of the delay time and a maximum delay time restriction representing the maximum value of the delay time are provided as the restriction value of the delay time which is specified by the path delay restriction information 112.

The path delay analysis means 104 is implemented by a CPU, etc. which are controlled by programs, and it serves to perform a delay analysis on each path. With respect to paths which have been already subjected to the placement and routing processing, the delay analysis is performed by using the placement and routing result concerned (hereinafter referred to as "actual placement result"). On the other hand, with respect to paths which have not yet been subjected to the placement and routing processing, the delay analysis is performed on the basis of temporary placement and routing result which are calculated on the basis of the type and position of circuit blocks (hereinafter referred to as "virtual routing result").

The relay buffer insertion means 105 is implemented by a CPU, etc. which are controlled by programs, and it serves to insert a desired relay buffer into a net on a path for which occurrence of a delay error is detected as a result of the path delay analysis of the path delay analyzing means 104. Here, as the relay buffer are prepared some kinds of buffer gates which are different in the internal delay time of the circuit (buffer gate delay) and the drive capacity. FIG. 2 show examples of buffer gates.

Figure 3:
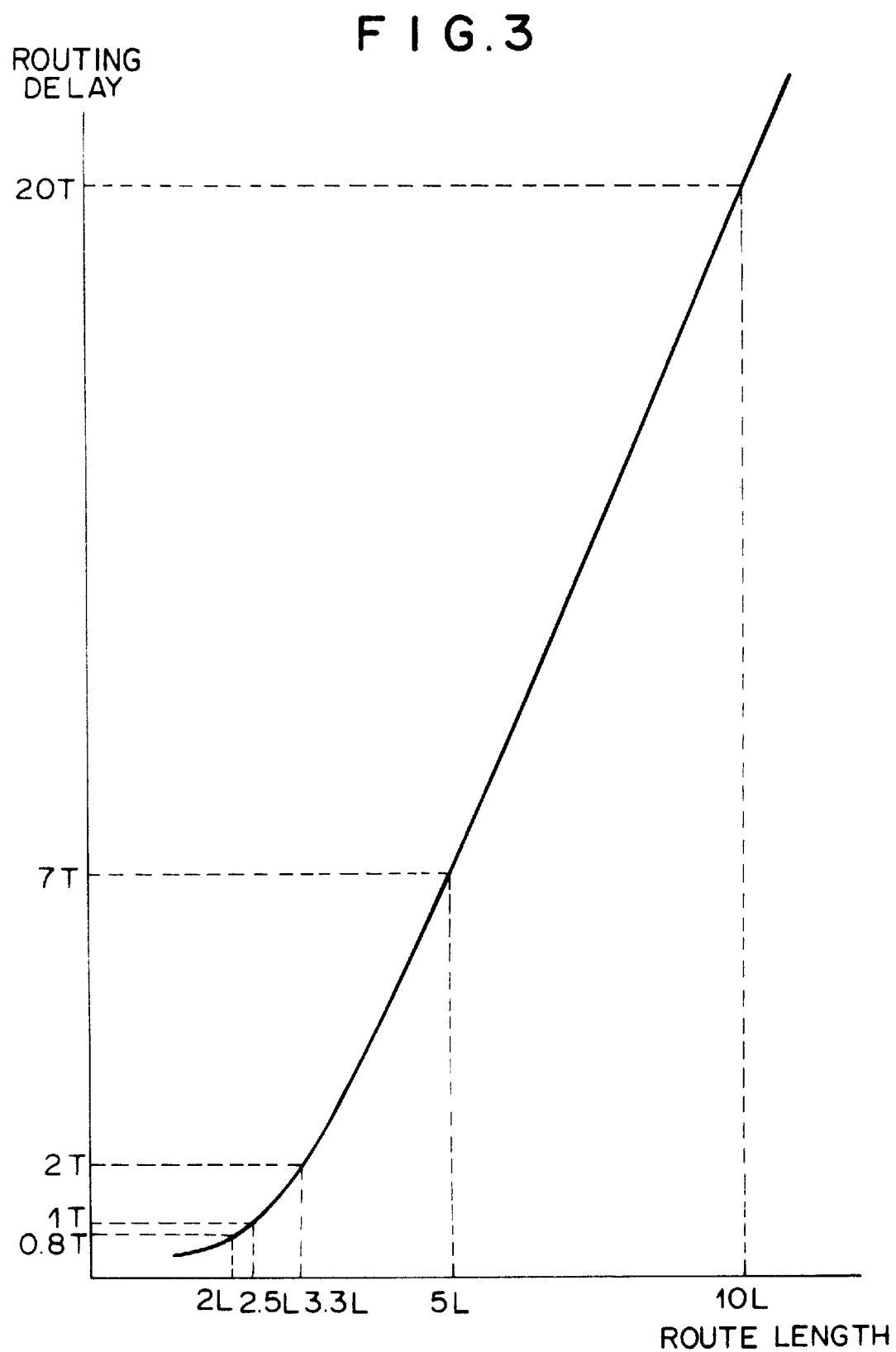
FIG. 3 is a diagram showing the drive performance of a relay buffer used in the embodiment.
Figure 7:
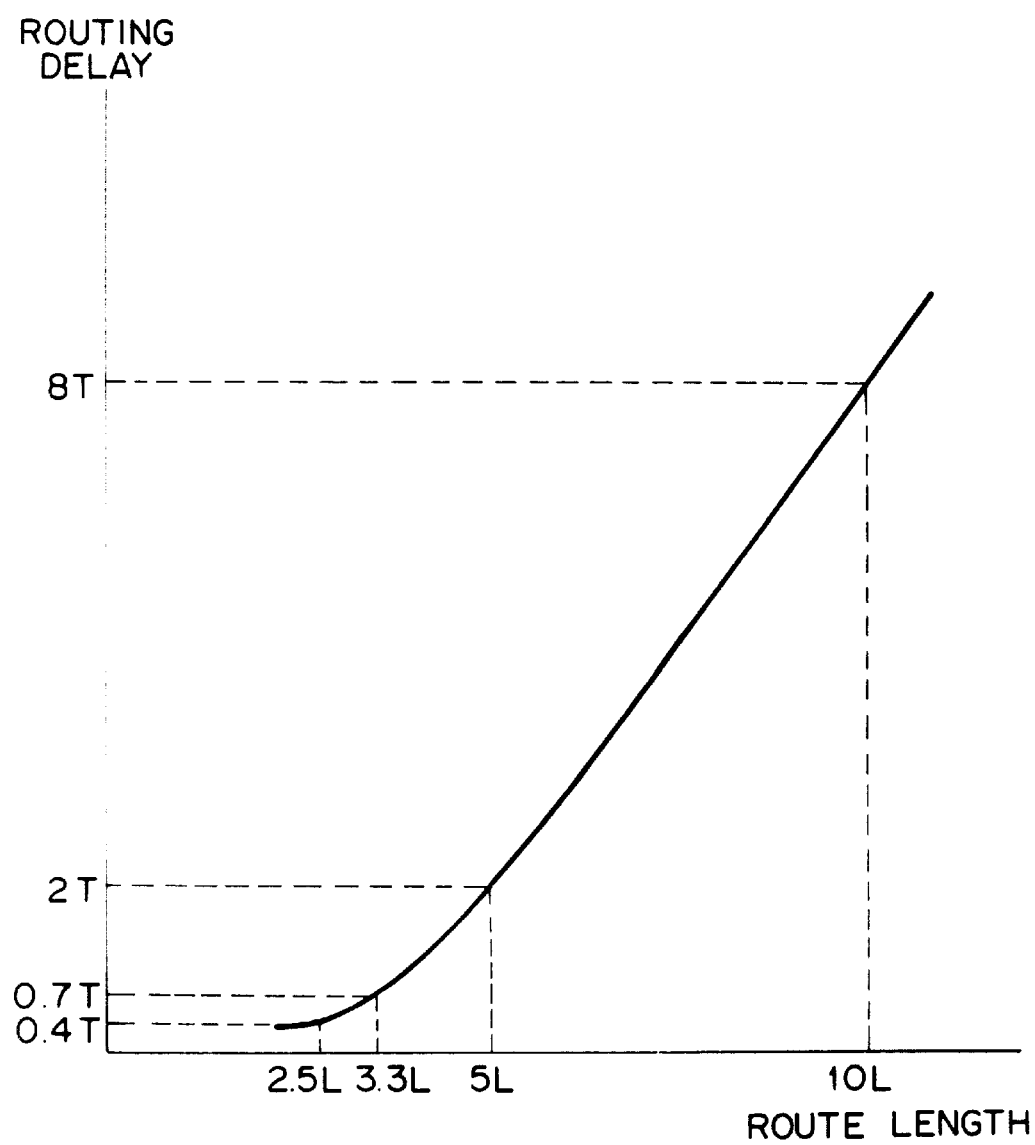
FIG. 7 is a diagram showing the drive performance of another relay buffer used in the embodiment.

In FIG. 2, a buffer gate 401 has a buffer gate delay of 0.5 T (T represents an unit of time) and a drive capacity shown in a media delay graph of FIG. 3. A buffer gate 402 has a buffer gate delay of 1 T and a drive capacity shown in a media delay graph of FIG. 5. A buffer gate 403 has a buffer gate delay of 2 T and a drive capacity shown in a media delay graph of FIG. 7. As is apparent from FIGS. 3, 5 and 7, there is such an effect that as the buffer gate has higher drive capacity, the routing delay can be reduced more remarkably for the long routing.

Figure 4:
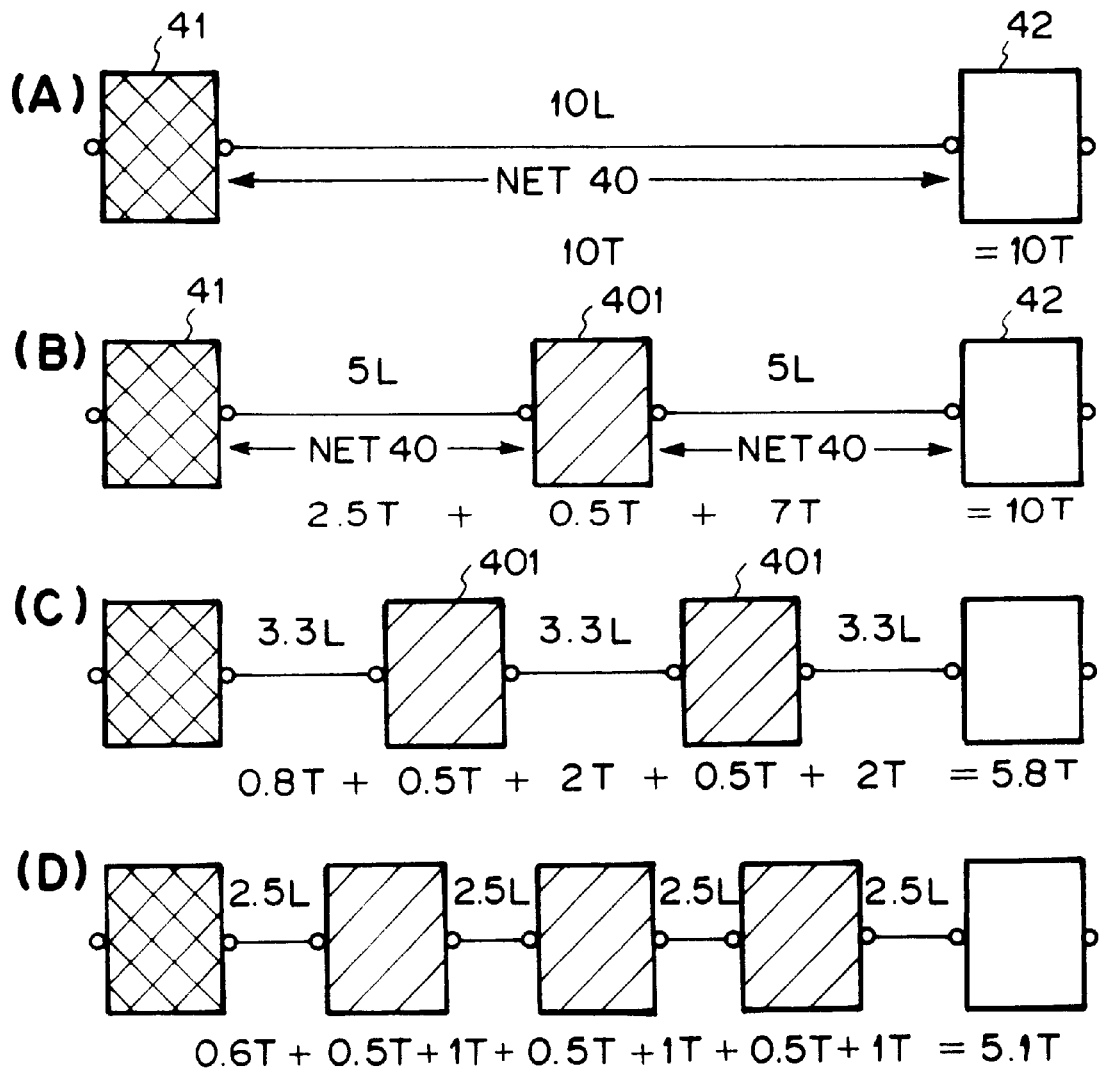
FIG. 4(A) to 4(D) are a diagram showing the variation of a delay time when the relay buffer shown in FIG. 3 is inserted into a net.
Figure 5:
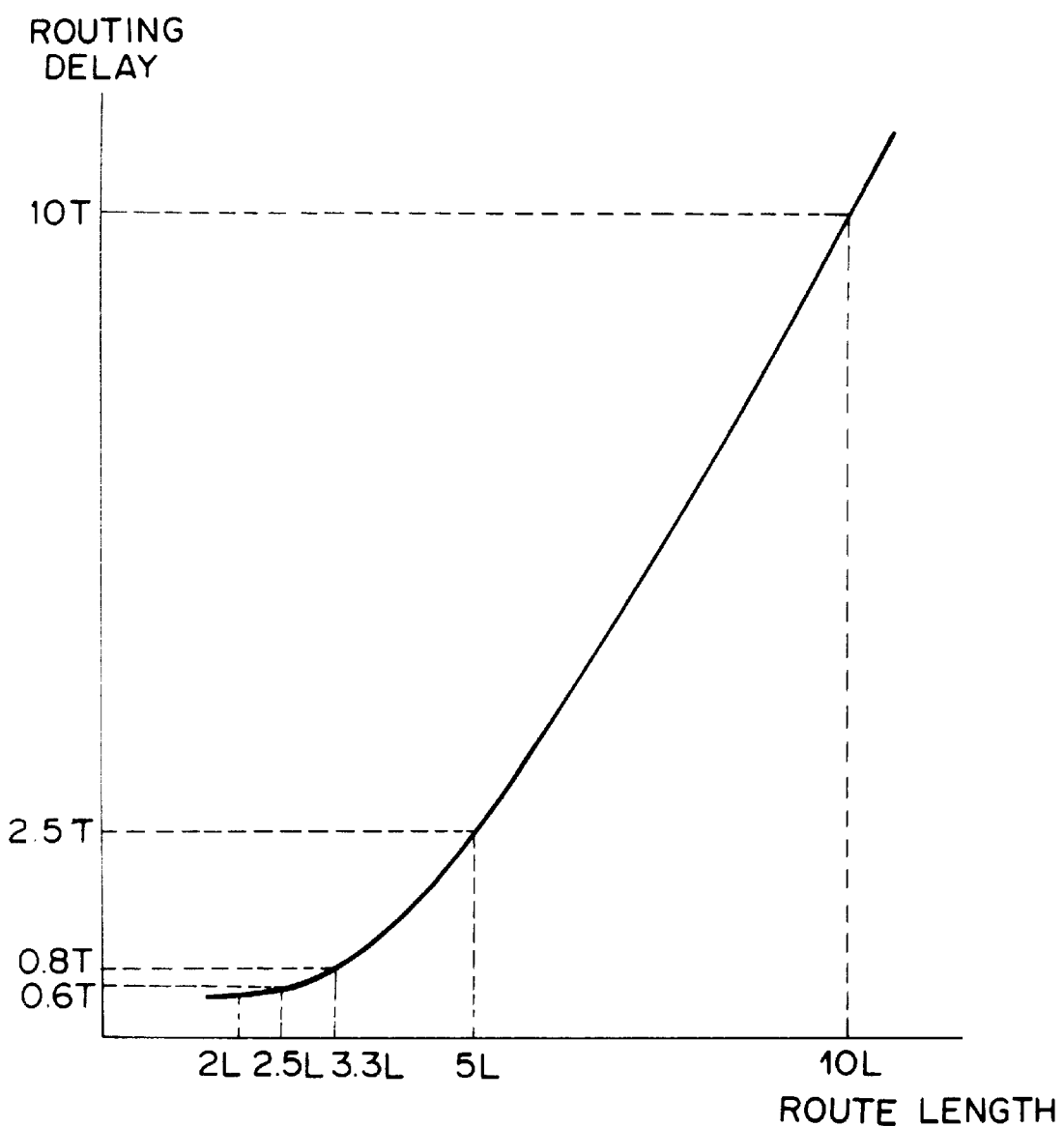
FIG. 5 is a diagram showing the drive performance of another relay buffer used in the embodiment.
Figure 6:
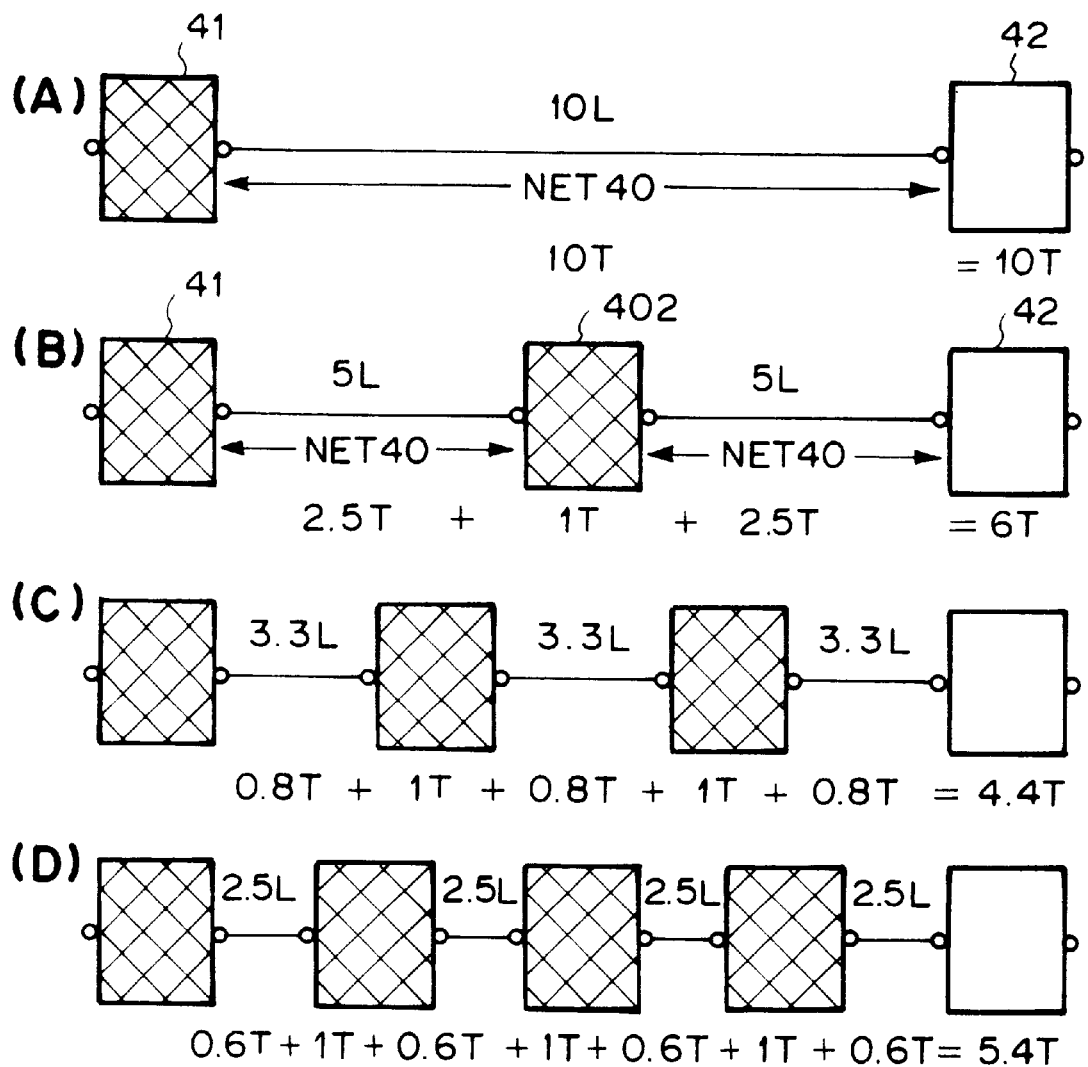
FIG. 6(A) to (D) are a diagram showing the variation of a delay time when the relay buffer shown in FIG. 5 is inserted into the net.
Figure 8:
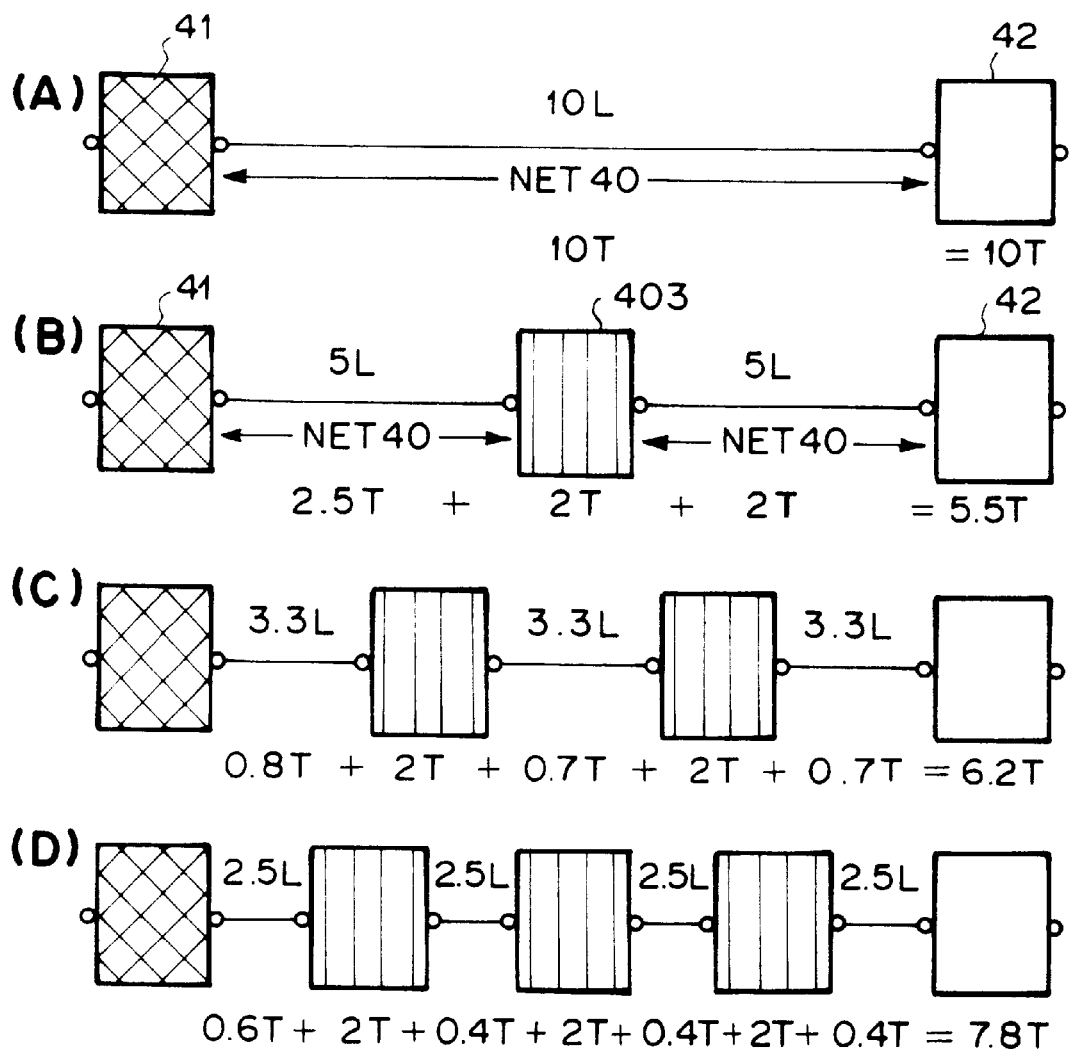
FIG. 8(A) to 8(D) are a diagram showing the variation of the delay time when the relay buffer shown in FIG. 7 is inserted into the net.

The relation between the routing delay in a prescribed net and the routing delay when the buffer gates 401, 402 and 403 are inserted in the net is shown in FIGS. 4, 6 and 8 respectively. In each figure, the drive capacity of the gate 41 at the output side of the net 40 concerned is assumed to be equal to that of the buffer gate 402 shown in FIG. 5. Accordingly, the routing delay of the net 40 having a length of 10 L in a state where the buffer gates 401, 402, 403 are not inserted is equal to 10 T (L represents an unit of length). In order to simplify the description, when the buffer gates 401, 402 and 403 are inserted, it is assumed that the same type buffer gates are inserted at equal-intervals.

First, the case where the buffer gate 401 is inserted will be described below.

Referring to FIG. 4, one buffer gate 401 is first inserted as shown in FIG. 4(B). Here, each of the net length of the net 40 from the output side of the gate 41 to the buffer gate 401 and the net length from the buffer gate 401 to the input side of the gate 42 is equal to 5 L, and thus the routing delay is equal to 2.5 T for the former net length of the net 40 and 7 T for the latter net length by referring to the media delay graphs of FIGS. 5 and 3. Further, the buffer gate delay of the buffer gate 401 is equal to 0.5 T, and thus the total delay time from the output side of the gate 41 to the input side of the gate 42 is equal to 10 T. Likewise, the total delay time when two buffer gates 401 shown in FIG. 4(C) are inserted is equal to 5.8 T, and the total delay time when three buffer gates 401 shown in FIG. 4(D) are inserted is equal to 5.1 T.

In the case where the buffer gate 402 is inserted, by referring to FIG. 6, the total delay time is equal to 6 T when one buffer gate 402 shown in FIG. 6(B) is inserted, to 4.4 T when two buffer gates 402 shown in FIG. 6(C) are inserted, and to 5.4 T when three buffer gates 403 shown in FIG. 6(D) are inserted.

Likewise, in the case where the buffer gate 403 is inserted, by referring to FIG. 8, the delay time is equal to 5.5 T when one buffer gate 403 is inserted as shown in FIG. 8(B), to 6.2 T when two buffer gates 403 shown in FIG. 8(C) are inserted, and to 7.8 T when three buffer gates 403 show in FIG. 8(D) are inserted.

As described above, the delay time of the net concerned can be adjusted in accordance with the conditions such as the type, the number and the insertion interval of the buffer gates to be inserted, etc. Accordingly, when there is a net in which a delay error occurs, the buffer gates are suitably combined and inserted into the net concerned by the relay buffer insertion means 106 to weed out the delay error.

The relay buffer placement means 106 is implemented by a CPU, etc. which are controlled by programs, and it serves to arrange the relay buffer inserted by the relay buffer insertion portion 105 on a passage which corresponds to the actual routing result or the virtual routing result. When the relay buffer cannot be disposed at a desired position due to another path, the relay buffer is disposed at a position which is adjacent to the desired position and at which the relay buffer can be disposed.

The incremental routing means 107 is implemented by a CPU, etc. which are controlled by programs, and it serves to wire a net which is divided due to the placement of the relay buffer by the relay buffer insertion means 105 and the relay buffer placement means 106, and rewire another net which induces a design rule error such as a routing short or the like due to the placement of the relay buffer.

Next, the layout design operation according to this embodiment will be described with reference to FIGS. 9 to 13 and FIG. 17.

Figure 9:
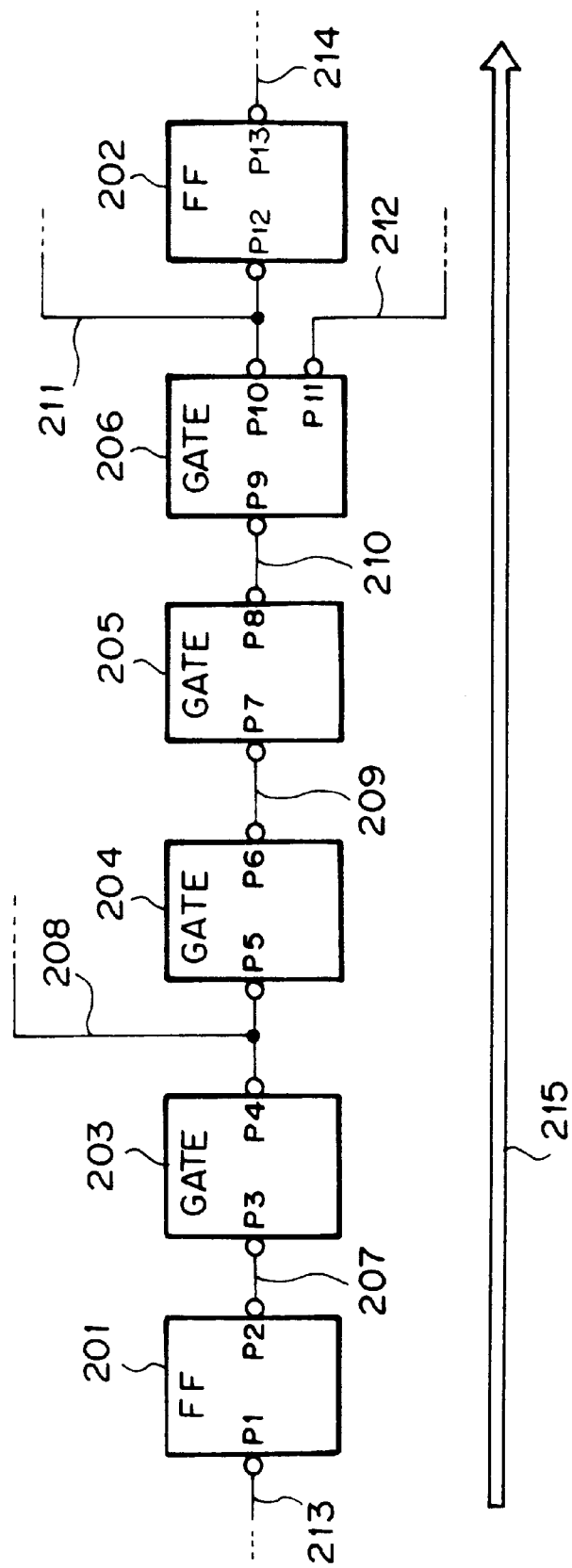
FIG. 9 is a diagram showing the logical connection relation of a logical circuit for which a layout design is performed according to the embodiment.

As an example of the operation is considered a layout design of a logical circuit having a logical connection relation shown in FIG. 9. As shown in FIG. 9, the logical circuit comprises flip flops 201 and 202, gates 203 to 206, and nets 207 to 214 through which the respective circuit blocks are connected respectively. Further, a path 215 exists as an inter-flip-flop path.

First, logical connection information 109 between circuit blocks, physical information 110 of the circuit blocks and delay information 111 used for a delay analysis are input as an initial state under the control of control means 101 by the logical/library input means 102. Further, a maximum delay time restriction is input as path delay restriction information 112 by the path delay restriction input means 103, and a restriction value 20 T is assumed to be set to all the inter-flip-flop paths.

Further, as an initial operation, there is obtained a result of placement and routing processing which is performed on the basis of only the logical connection relation in no consideration of the delay time restriction as in the case of the conventional layout design apparatus. In this case, the placement and routing result thus obtained is the same as the conventional placement and routing result shown in FIG. 17. Here, the delay time of the path 215 in the placement and routing result is assumed to be 25 T. Accordingly, in the placement and routing result concerned, the path 215 violates the maximum delay time restriction which is set in the path delay restriction information 112. This placement and routing result is input as placement and routing result information 113 by the logical/library input means 102.

Next, the delay analysis of all the paths is performed by the path delay analysis means 104. That is, the maximum delay time restriction of the path delay restriction information 112 and the delay time of each path are compared with each other to detect a path in which a delay error occurs. In the present case, the delay time of the path 215 is equal to 25 T, and thus it is over the restriction value 20 T of the maximum delay time restriction. Therefore, the path 215 is detected as a path having a delay error.

Next, with respect to the detected path having the delay error, the relay buffer insertion means 105 refers to the delay information 111, and selects a net which can weed out the delay error of the overall path concerned, on the basis of the routing length of the net constituting the path concerned and the drive capacity of the output gate. Here, the net which can weed out the delay error of the overall path is defined as a net in which, by inserting a suitable buffer gate(s), the delay time can be shortened by an amount which is not less than an excess delay time of the path concerned with respect to the delay time corresponds to the maximum delay time restriction, In the case of the path 215, the excess delay time is equal to 5 T (=25 T–20 T), and thus any net which can shorten the delay time by 5 T or more is selected as a target. By referring to the delay information 111, one or more buffer gates with which the delay error can be reduced are selected for the selected net, and inserted as a relay buffer(s) into the logical connection relation of the path concerned, thereby renewing the logical connection information 109.

The detailed operation of the relay buffer insertion means 105 for inserting one or more relay buffers in a net 209 in the logical circuit shown in FIG. 9 to weed out the delay error will be described hereunder.

For example, it is assumed that the drive performance of the gate 204 is identical to the drive performance shown in the media delay graph show in FIG. 5, and the length of the routing corresponding to the net 209 is set to 10 L. This net is equivalent to the net 40 shown in FIGS. 4, 6 and 8. Referring to FIG. 6, in the case of FIG. 6(C), the total delay time is equal to 4.4 T, and thus the delay time is shorter by 5.6 T than the delay time 10 T in the case where no relay buffer is inserted in the net concerned. This value is larger than the excess delay time (5 T) with respect to the maximum delay time restriction of the delay time of the overall path 215. That is, by using this case, the delay time of the overall path 215 is equal to 19.4 T, and it is shorter than the restriction value 20 T of the maximum delay time restriction, and thus the delay error can be reduced.

Figure 10:
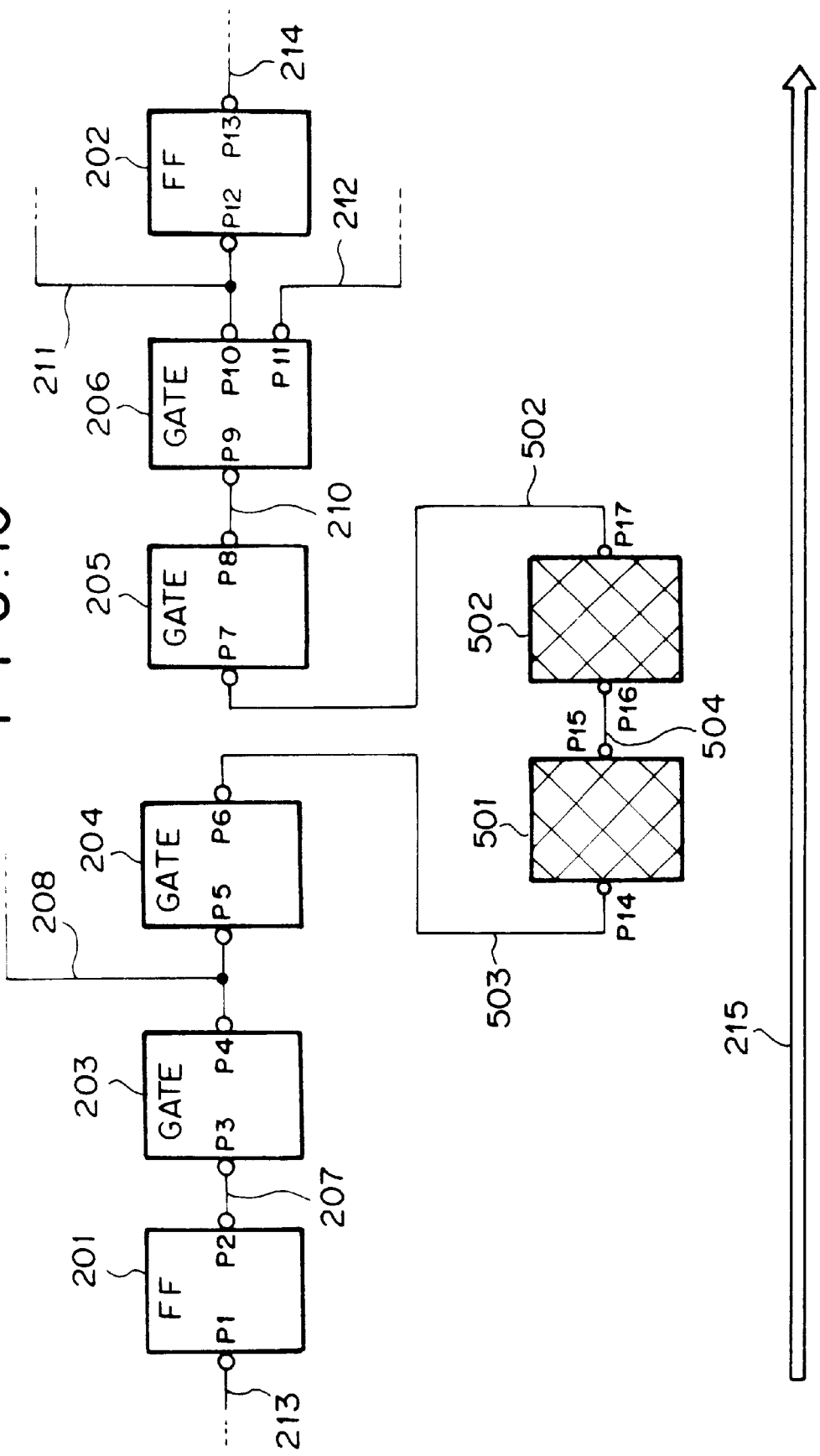
FIG. 10 is a diagram showing the logical connection relation when a relay buffer is added to the logical circuit shown in FIG. 9 according to this embodiment.
Figure 11:
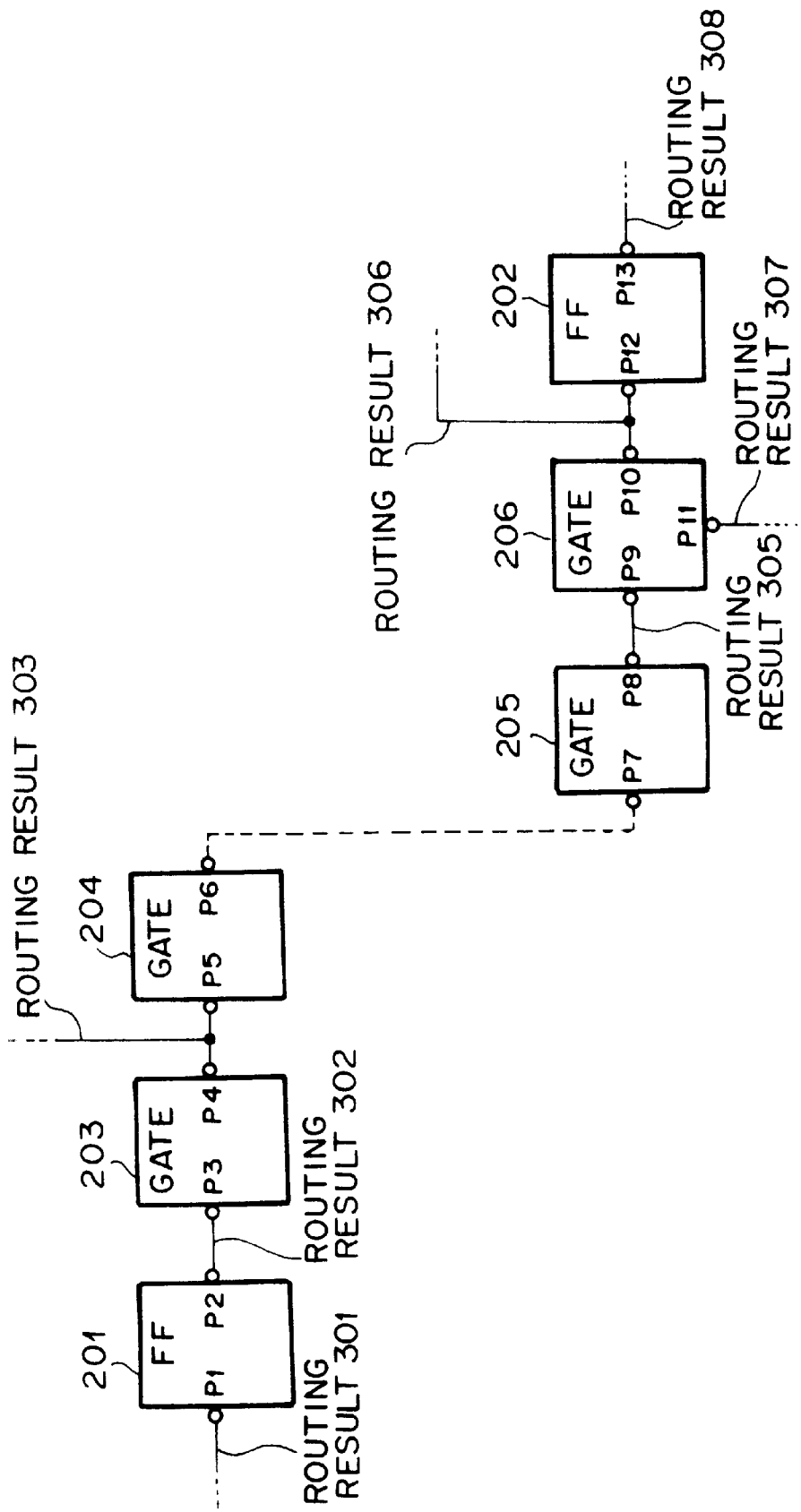
FIG. 11 is a diagram showing a step for reducing a delay error of a layout result according to the embodiment, and it shows the status when the routing of a net in which the relay buffer is inserted is deleted.

Accordingly, the relay buffer insertion means 105 inserts two buffer gates 402 shown in FIG. 2 to renew the logical connection information 109. FIG. 10 shows a renewed logical connection relation. As shown in FIG. 10, a logical connection relation comprising buffer gates 501 and 502, and nets 503, 504 and 505 which are obtained by dividing the net 209 into three parts, is inserted at the position of the net 209 shown in FIG. 9. The relay buffer insertion means 105 also deletes a wire 304 (routing result) corresponding to the net 209 from the placement and routing result information 113 shown in FIG. 17 simultaneously with the renewal of the logical connection information 109. However, the shape of the routing result is stored, and this information is used in the processing of the relay buffer placement means 106. The routing result when the wire 304 is deleted is shown in FIG. 11.

In a selection process of selecting a suitable combination of buffer gates to be inserted, the selection of the type and number of the buffer gates and the optimal routing dividing position can be calculatively determined when a delay calculation can be formulated.

Further, the actual delay time cannot be simply calculated by summation, and it is difficult to accurately determine it before the placement and routing process. Therefore, it is preferable to select relay buffers with sufficient lead time. When it is detected that the delay error could not be eliminated even by inserted relay buffers due to an estimation failure, the process returns to the processing stage of the relay buffer insertion means 105 to select a net and buffer gates to be inserted again.

In the above case, the delay error can be reduced by inserting relay buffer(s) into one net. In the case where the delay error cannot be perfectly reduced by only insertion of the relay buffers into one net, the same processing is performed on some nets on the same path to weed out or reduce the delay error.

As described above, after the relay buffer(s) are inserted by the relay buffer insertion means 105, the relay buffer placement means 106 arranges the relay buffers 501 and 502 thus inserted at suitable positions on a path of a deleted routing result 304. It is preferable that the relay buffer 501 is disposed at such a position that a delay-time reducing effect is as much as possible. However, there may occur a case where the relay buffer cannot be arranged at the optimum position due to the positional relation between the relay buffer and another path. In this case, the relay buffer is arranged at a position which is proximate to the optimum position and at which the relay buffer is permitted to be arranged.

Figure 12:
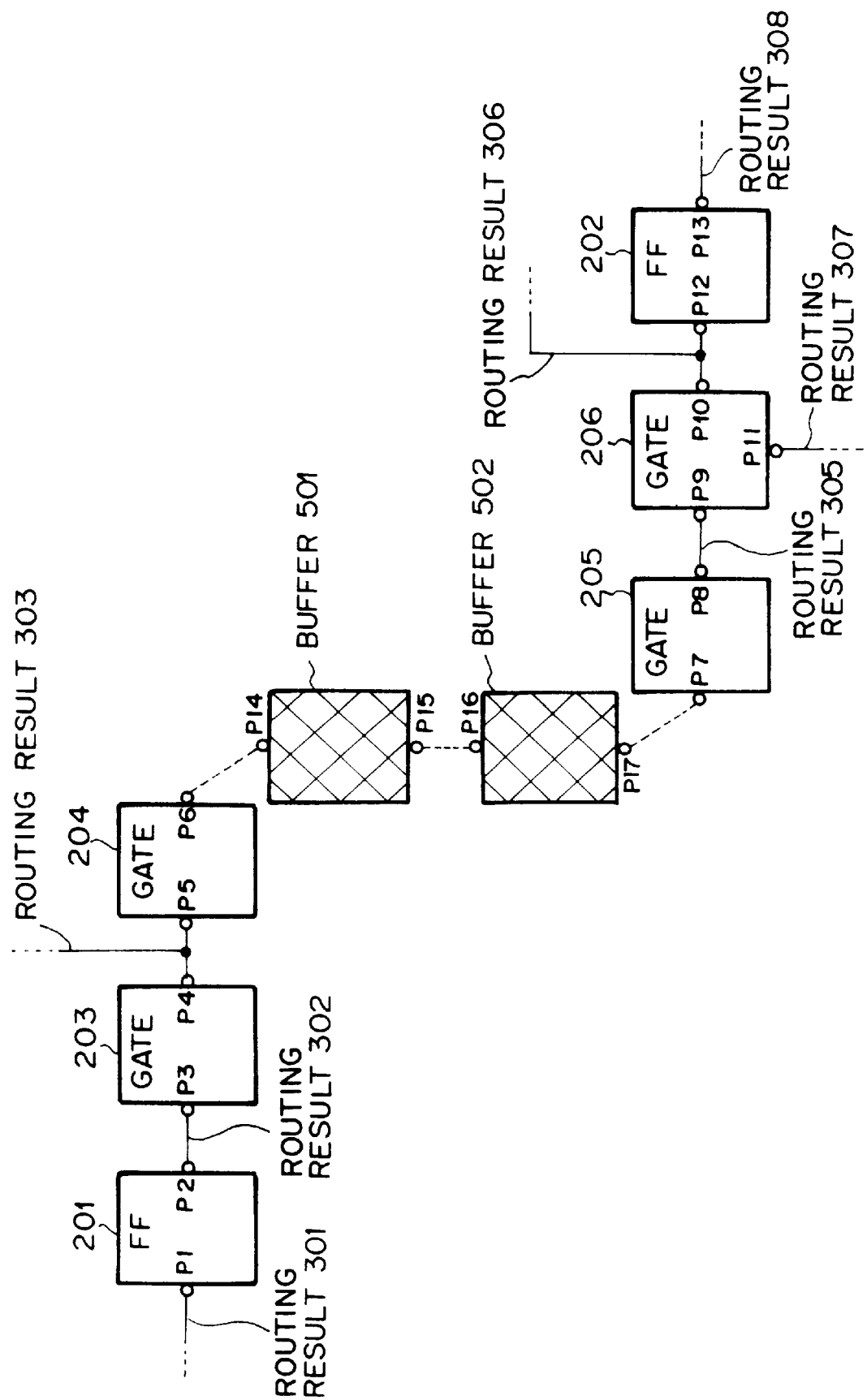
FIG. 12 is a diagram showing a step of reducing the delay error of the layout result to the logical circuit shown in FIG. 9 according to the embodiment, and shows the state where the relay buffer is arranged.

FIG. 12 shows the routing result when the relay buffer 501 is arranged on the basis of the above-described processing. In the case of FIG. 12, the relay buffers 501 and 502 are arranged at the positions at which the routing 304 is divided into three equal parts. In this case, any routing of another net does not exist at these placement positions of the relay buffers 501 and 502. However, when such a routing exists, any routing which induces a routing short or a routing inhibition violation is deleted.

Figure 13:
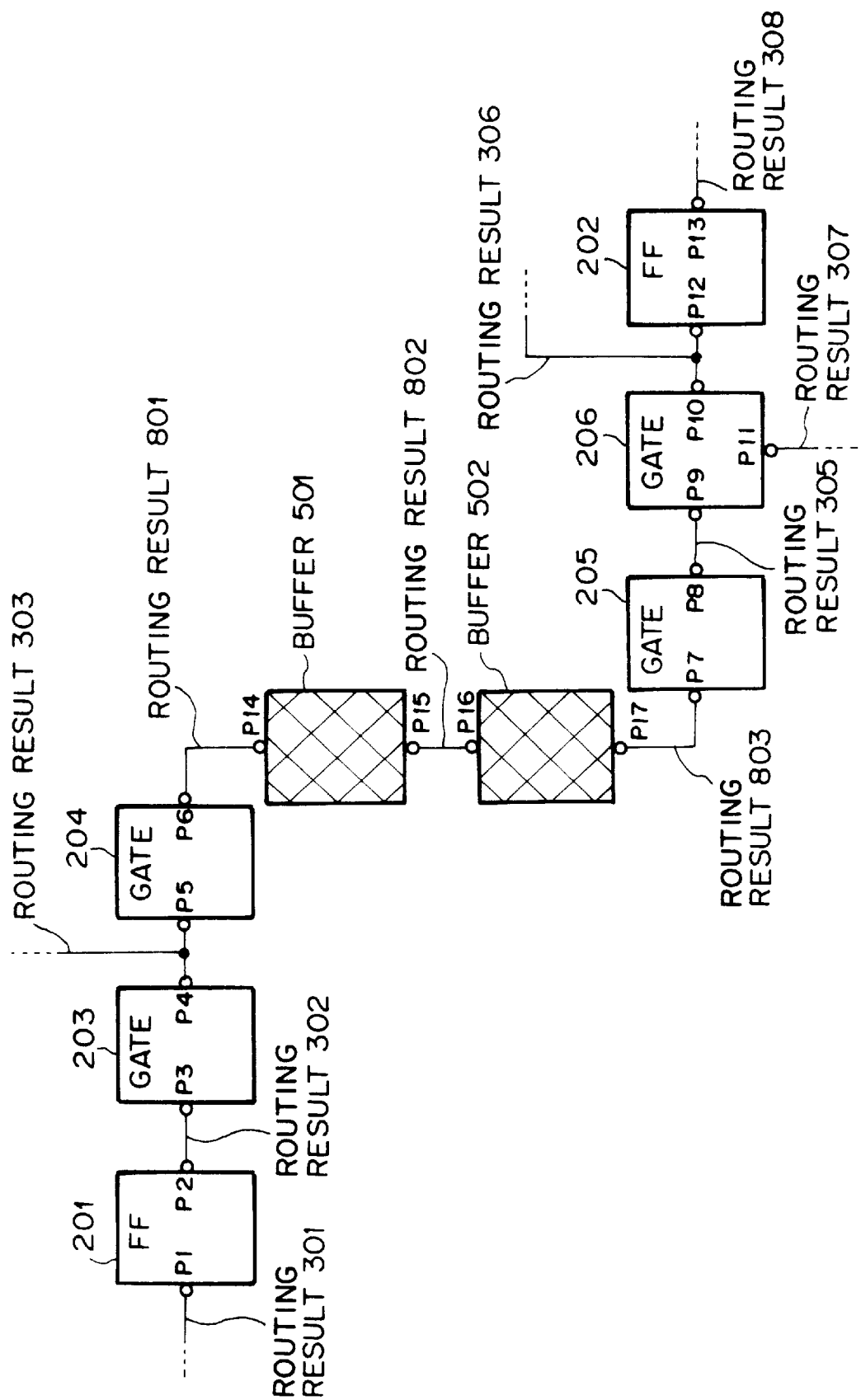
FIG. 13 is a diagram showing a step for reducing the delay error of the layout result according to the embodiment, and shows the state where the rerouting is performed.

Thereafter, the incremental routing means 107 performs a routing work on the nets 503, 504 and 505 which have not been unrouted, thereby obtaining routing results 801, 802 and 803 from which the delay error is reduced as shown in FIG. 13. In this case, there are obtained routing results which are not bypassed and have substantially the same wire length as estimated by the relay buffer insertion means 105.

In the above operation, the processing is performed by using the actual routing result as a target. However, when no actual routing result exists, the processing may be performed by estimating a virtual routing result. Further, in order to insert the relay buffer, the routing length and the delay time are graphed to obtain the optimum insertion result. However, the buffer insertion rule may be simplified to shorten the processing time by using a means for beforehand determining the type and number of buffer gates to be inserted in accordance with the routing length.

The foregoing description is relating to the operation of reducing the delay error when the maximum delay time restriction of a path is set as the path delay time restriction information 113. However, when the minimum delay time restriction of a path is set as the path delay time restriction information 113, the relay buffer may be considered as a delay gate and arranged on a suitable net to reduce the delay error.

Figure 14:
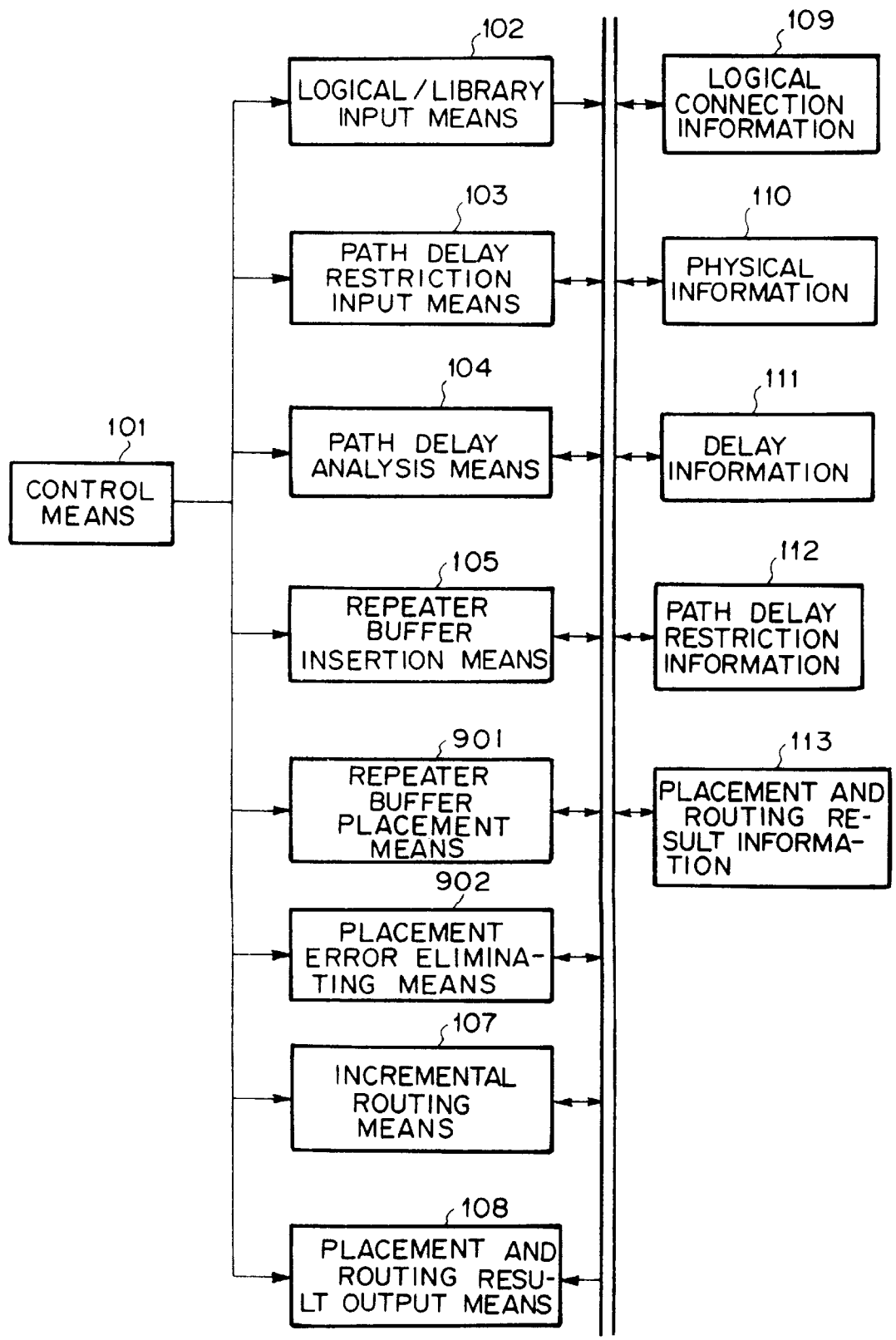
FIG. 14 is a block diagram showing the construction of a layout design apparatus according to a second embodiment of the present invention.

FIG. 14 is a circuit block diagram showing the construction of a layout design apparatus according to a second embodiment of the present invention.

As shown in FIG. 14, the layout design apparatus of this embodiment includes a logical/library input means 102 for inputting logical connection information, etc., path delay restriction input means 103 for inputting the delay restriction of each path, path delay analysis means 104 for performing a delay analysis on a path, relay buffer insertion means 105 and relay buffer placement means 901 which serve to insert a relay buffer (relay buffers) required for a net on a path, placement error eliminating means 902 for eliminating an error on a wire which occurs as a result of the insertion of the relay buffer(s), incremental routing means 107 for rewire the net, placement and routing output means 108 for outputting an placement and routing result, and control means 101 for controlling the above means.

In the above construction, the control means 101, the logical/library input means 102, the path delay restriction input means 103, the path delay analysis means 104, the relay buffer insertion means 105, the incremental routing means 107 and the placement routing output means 108 are the same as those of the first embodiment, and thus the description thereof is omitted from the following description.

The relay buffer placement means 201 is implemented by a CPU, etc. which are controlled by programs, and its basic function is the same as the relay buffer placement means 106 of the first embodiment. According to the first embodiment, when the relay buffer placement means 106 cannot arrange the relay buffer at the optimum position, it searches an area which is proximate to the optimum position and at which the relay buffer is permitted to be arranged, and then it arranges the relay buffer at that area. On the other hand, according to the second embodiment, the relay buffer placement means 901 arranges the relay buffer at the optimum position irrespective of the placement of another gate or the routing of a net.

The placement error eliminating means 902 is implemented by a CPU, etc. which are controlled by programs. When the placement of a relay buffer by the relay buffer placement means 901 causes a gate to be overlapped with the relay buffer at the placement position, the placement error eliminating means 902 affords preference to the relay buffer and displaces the gate concerned to such a position that the positional overlap (placement error) between the relay buffer and the gate is reduced. Following this operation, the routing result of a net which is connected to the positionally displaced gate and a routing result of a net in which routing short or routing inhibition violation is induced, are deleted. The deleted net is rewired by the incremental routing means 107.

Figure 15:
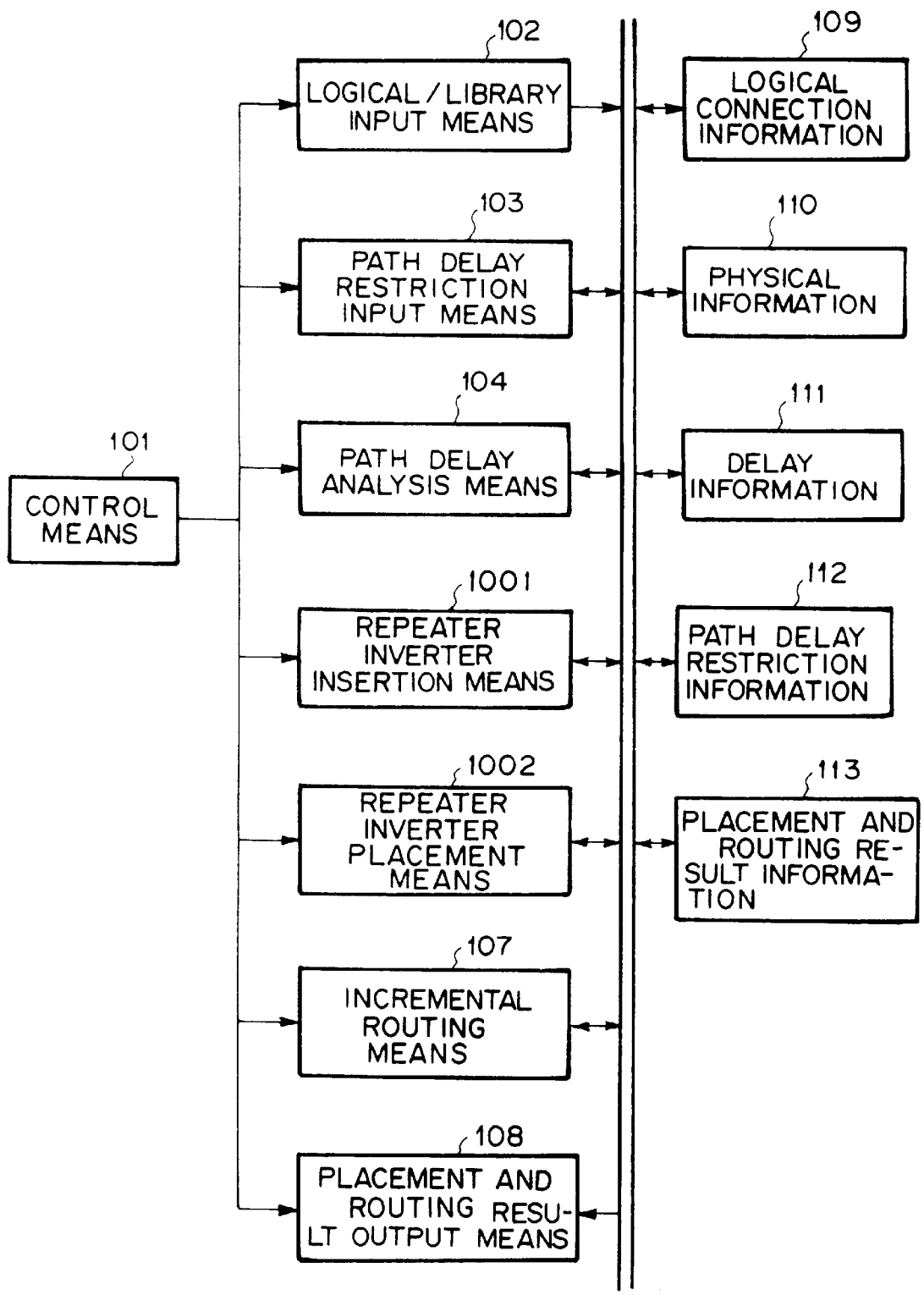
FIG. 15 is a block diagram showing the construction of a layout design apparatus according to a third embodiment of the present invention.

FIG. 15 is a circuit block diagram showing the construction of a layout design apparatus according to a third embodiment of the present invention.

As shown in FIG. 15, the layout design apparatus of this embodiment includes logical/library input means 102 for inputting logical connection information, etc., path delay restriction input means 103 for inputting the delay restriction of each path, path delay analysis means 104 for performing a delay analysis of the path, relay inverter insertion means 1001 and relay inverter placement means 1002 which serve to insert a relay inverter which is required for a net on a path, incremental routing means 107 for rerouting the net, placement and routing output means 108 for outputting an placement and routing result, and control means 101 for controlling the above means.

In the above-described construction, the control means 101, the logical/library input means 102, the path delay restriction input means 103, the path delay analysis means 104, the incremental routing means 107 and the placement and routing output means 108 are the same as the first embodiment shown in FIG. 1, and the description thereof is omitted from the following description.

The relay inverter insertion means 1001 is implemented by a CPU, etc. which are controlled by programs, and it inserts a necessary relay inverter into a net on a path for which occurrence of a delay error is detected as a result of the path delay analysis of the path delay analysis means 104.

As the relay inverter are prepared some types of inverters which are different in delay time and drive capacity in the circuit. The selection of a net into which inverters are inserted, and the determination of a combination of the type and number of the inverters to be inserted, are performed in the same procedure as the selection of a net into which relay buffers are inserted by the relay buffer insertion means 105 and the determination of a combination of the type and number of buffer gates according to the first embodiment. However, even-number of inverters are inserted as a group because the logical (polarity: positive or negative) is inverted every time an inverter is inserted.

The relay inverter placement means 1002 is implemented by a CPU, etc. which are controlled by programs, and it arranges the relay inverter inserted by the relay inverter insertion means 1001 on the path which corresponds to an actual routing result or virtual routing result. When the relay inverter cannot be arranged at a desired position due to a positional relation with another path, it arranges the relay inverter at a position which is proximate to the position concerned and at which the relay inverter is permitted to be arranged.

Figure 16:
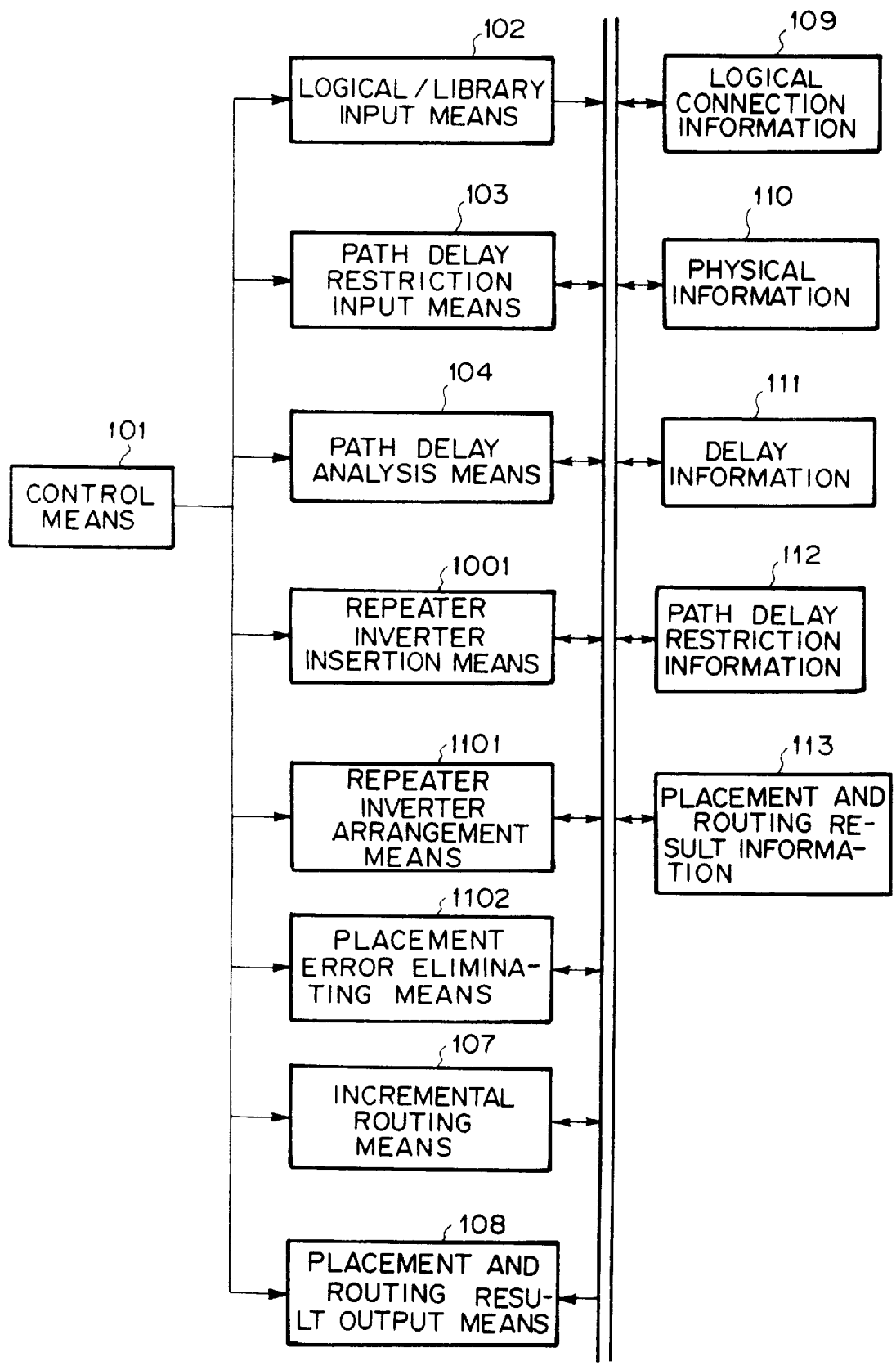
FIG. 16 is a block diagram showing the construction of a layout design apparatus according to a fourth embodiment of the present invention.
Figure 17:
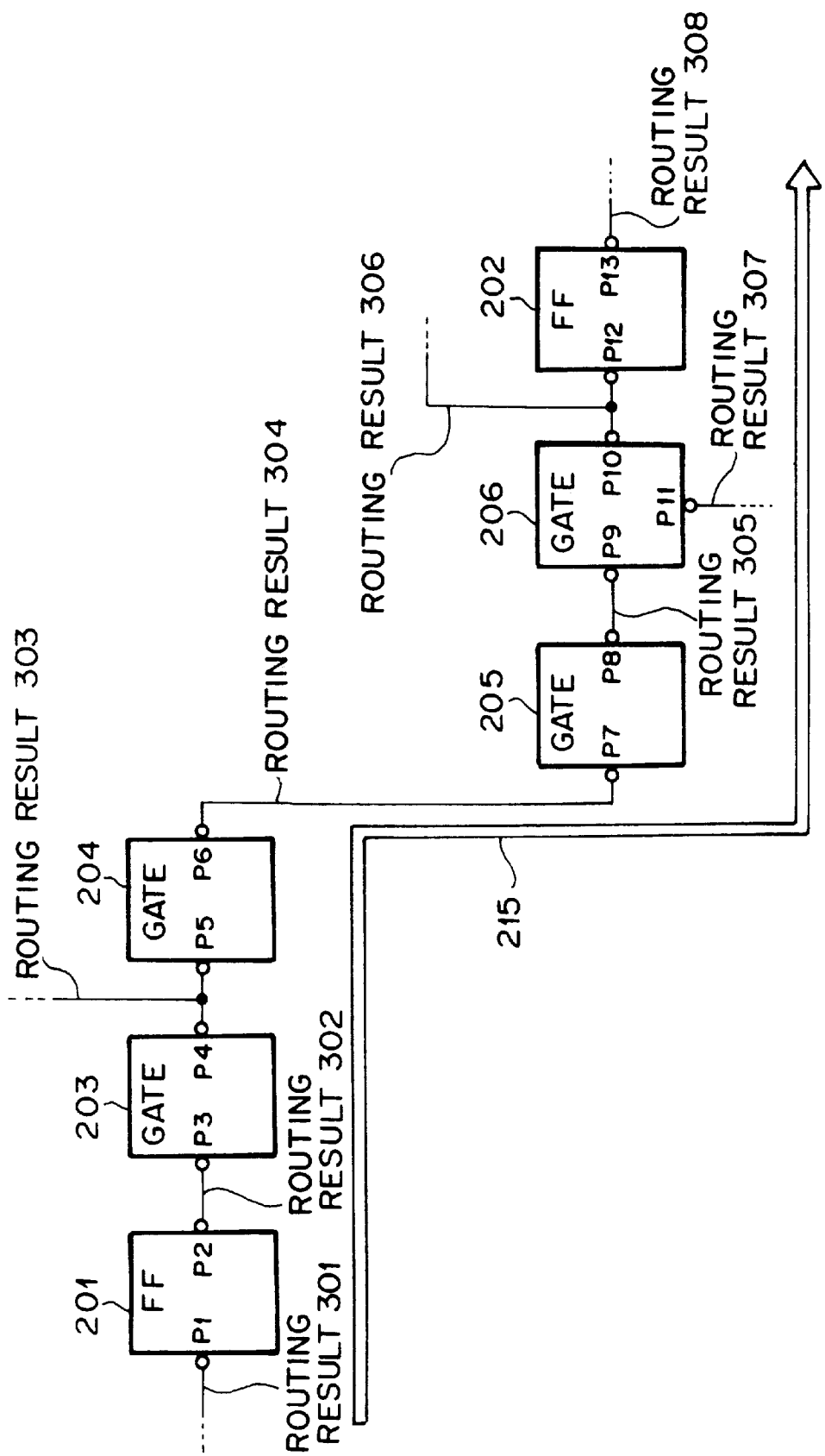
FIG. 17 is a diagram showing a layout design result of a logical circuit shown in FIG. 9 according to a conventional layout design apparatus.

FIG. 16 is a circuit block diagram showing the construction of a layout design apparatus according to a fourth embodiment of the present invention.

As shown in FIG. 16, the layout design apparatus of this embodiment includes logical/library input means 102 for inputting logical connection information, etc., path delay restriction input means 103 for inputting the delay restriction of each path, path delay analysis means 104 for performing a delay analysis on a path, relay inverter insertion means 1001 and relay inverter placement means 1101 which serve to insert a necessary relay inverter (relay inverters) into a net on a path, placement error eliminating means 1102 for eliminating an error occurring on a routing as a result of the insertion of the relay buffer(s), incremental routing means 107 for rewire the net, placement and routing output means 108 for outputting an placement and routing result, and control means 101 or controlling the above means.

In the above construction, the control means 101, the logical/library input means 102, the path delay restriction input means 103, the path delay analysis means 104, the incremental routing means 107 and the placement and routing output means 108 of this embodiment are identical to those of the first embodiment shown in FIG. 1, and the relay inverter insertion means 1001 of this embodiment is identical to that of the third embodiment shown in FIG. 15. Therefore, the description of these means is omitted from the following description.

The relay inverter placement means 1101 is implemented by a CPU, etc. which are controlled by programs, and its basic function is identical to that of the relay inverter placement means 1002 of the third embodiment. When the relay inverter placement means 1002 of the third embodiment cannot arrange the relay buffer at the optimum position, it searches an area which is proximate to the optimum position and at which the relay buffer is permitted to be arranged, and arranges the relay buffer at that area. On the other hand, the relay inverter placement means 1101 of this embodiment arranges the relay inverter at the optimum position irrespective of the placement of another gate or the routing of the net.

The placement error eliminating means 1102 is implemented by a CPU, etc. which are controlled by programs. When the placement of a relay inverter by the relay inverter placement means 1101 causes a gate to be overlapped with the relay inverter at the placement position, the placement error eliminating means 1102 affords preference to the relay inverter, and positionally displaces the gate until the overlap of the placement (placement error) is extinguished (reduced). Following this operation, there are deleted routing results of a net which is connected to the positionally displaced gate and routing result of a net in which a routing short or a routing inhibition violation is induced. The deleted net is rewired by the incremental routing means 107.

The above-described embodiments are preferable embodiments according to the present invention, however, the present invention is not limited to these embodiments.

As described above, the layout design apparatus of the present invention performs a delay analysis on a layout result, and if a delay error is detected, it conducts a logical alteration on a logical circuit to retry placement and routing processing so that the delay error is reduced. Therefore, even when a path having a severe delay time restriction is contained, a layout result having no path delay error can be obtained.

Further, since the logical alteration of the logical circuit and the placement and routing processing are automatically retried, no manual logical correction work and no placement and routing work are required, and thus a large number of steps are not necessary to reduce the delay error.

Still further, when the placement and routing processing is performed again, the incremental placement and routing processing is performed on the initial layout result, so that the increase of the processing time is little, and the delay can be improved (reduced) with high precision.

In addition, since it is sufficient to insert only the repeater gates which are necessary to eliminate the delay error, deterioration of a routability due to addition of repeater gates and increase of power consumption can be suppressed to the minimum level.

Further, the delay error can be reduced greater than altering the logic of the logical circuit and can be minimized.

Although the present invention has been shown and described with respect to best mode embodiments thereof, it should be understood by those skilled in the art that the foregoing and various other changes, omissions, and addition in the form and detail thereof may be made therein without departing from the spirit and scope of the present invention.

What is claimed is:

1. A layout design apparatus for arranging circuit elements and routing the circuit elements to perform a layout design of a logical circuit, comprising:

a delay analyzer for performing delay analysis processing on a layout result which is obtained by performing a layout design of a logical circuit with a predetermined method, wherein said delay analyzer detects delay error introduced by the routing of the circuit elements;

a logical alteration device for performing a logical alteration of the logical circuit to reduce the delay error, wherein said logical alteration device is provided with a repeater gate insertion device for automatically selecting and inserting a repeater gate having a delay characteristic and a drive performance to reduce delay error introduced by the routing of the circuit elements; and a rerouter for automatically rerouting the circuit elements in accordance with the result of the logical alteration by said logical alteration device.

2. The layout design apparatus as claimed of claim 1, wherein said repeater gate comprises an inverter, and said repeater gate insertion device inserts an even-number of inverters into the logical circuit.

3. The layout design apparatus as claimed in claim 1, wherein said rerouter comprises:

a repeater gate placement device for arranging said repeater gate in accordance with the layout result on the basis of the insertion result of said repeater gate insertion device; and a placement error eliminating device for affording preference to said repeater gate and displacing another circuit element when the other element exists at a placement position which is indicated for said repeater gate by said repeater gate insertion device.

4. The layout design apparatus as claimed of claim 3, wherein said repeater gate comprises an inverter, and said repeater gate insertion means inserts an even-number of inverters into the logical circuit.

5. The layout design apparatus as claimed in claim 3, wherein said repeater gate comprises a buffer gate.

6. The layout design apparatus as claimed in claim 1, wherein said delay analyzer is a path delay analyzer which detects a path which occurs a delay error with result to compare each of the delay time of the path with a minimum delay time restriction of a path delay restriction information.

7. The layout design apparatus as claimed in claim 1, wherein said rerouter is provided with repeater gate placement device for arranging said repeater gate in accordance with the layout result on the basis of the insertion result of said repeater gate insertion device.

8. The layout design apparatus as claimed of claim 7, wherein said repeater gate comprises an inverter, and said repeater gate insertion device inserts an even-number of inverters into the logical circuit.

9. The layout design apparatus as claimed in claim 7, wherein when another circuit element exists at a placement position which is indicated for said repeater gate by said repeater gate insertion device, said repeater gate placement device arranges said repeater gate at a position which is proximate to the placement position and at which said repeater gate is permitted to be arranged.

10. The layout design apparatus as claimed in claim 9, wherein said rerouter comprises:

repeater gate placement device for arranging said repeater gate in accordance with the layout result on the basis of the insertion result of said repeater gate insertion device; and placement error eliminating device for affording preference to said repeater gate and displacing another element when the other element exists at an placement position which is indicated for said repeater gate by said repeater gate insertion device.

11. The layout design apparatus as claimed in claim 10, wherein said repeater gate comprises a buffer gate.

12. The layout design apparatus as claimed in claim 11, wherein said repeater gate comprises an inverter, and said repeater gate insertion device inserts an even-number of inverters into the logical circuit.

13. The layout design apparatus as claimed in claim 1, wherein said delay analyzer is a path delay analyzer which detects a delay error within a path, wherein said path delay analyzer compares the delay time of the path with a maximum delay time restriction contain in path delay restriction information.

* * * * *